United States Patent [19]

Hanak

[11] 4,167,015
[45] Sep. 4, 1979

[54] CERMET LAYER FOR AMORPHOUS SILICON SOLAR CELLS

[75] Inventor: Joseph J. Hanak, Lawrenceville, N.J.

[73] Assignee: RCA Corporation, New York, N.Y.

[21] Appl. No.: 899,242

[22] Filed: Apr. 24, 1978

[51] Int. Cl.² .................................... H01L 29/161
[52] U.S. Cl. .................................... 357/16; 357/4; 357/30; 357/61
[58] Field of Search ............... 357/16, 4, 30, 61, 54

[56] References Cited

U.S. PATENT DOCUMENTS

| | | | |
|---|---|---|---|
| 3,843,420 | 10/1974 | Gittleman | 148/31.55 |
| 3,919,589 | 11/1975 | Hanak | 315/71 |
| 4,064,521 | 12/1977 | Carlson | 357/2 |
| 4,071,426 | 1/1978 | Pinch | 204/192 F |
| 4,126,150 | 11/1978 | Bell | 136/89 |

OTHER PUBLICATIONS

Wronski et al., *J. Appl. Phys.*; vol. 45, No. 1, 1974, pp. 295 et seq.
Wronski et al., *I.E.E.E. Transactions On Electronic Devices*, vol. ED-24, No. 4 (1977) pp. 351-357.
Lehmann, *J. Appl. Phys*, vol 43, No. 4, Apr. 1972, pp. 1666 et seq.
Carlson, *IEEE Transactions on Electron Devices*, vol. ED-24, No. 4, Apr. 1977, pp. 449 et seq.
Hanak, *Journal of Materials Science*, vol. 5, pp. 964 et seq., 1970.
Hanak, *J. Appl. Phys.*, vol. 44, No. 11, pp. 5142 et seq., 1973.
Abelis, *Appl. Phys. Solid State Sci.*, Academic Press, vol. 6, 1976, pp. 407 et seq.

*Primary Examiner*—Martin H. Edlow
*Attorney, Agent, or Firm*—Birgit E. Morris; A. Stephen Zavell

[57] ABSTRACT

A transparent high work function metal cermet forms a Schottky barrier in a Schottky barrier amorphous silicon solar cell and adheres well to the P+ layer in a PIN amorphous silicon solar cell.

16 Claims, 3 Drawing Figures

CERMET LAYER FOR AMORPHOUS SILICON SOLAR CELLS

This invention relates to silicon solar cells. More specifically, this invention relates to improved amorphous silicon solar cells.

The invention described herein was made during the performance of work under Energy Research Development Administration Contract No. EY-76-C-03-1286.

BACKGROUND OF THE INVENTION

Photovoltaic devices such as solar cells are capable of converting solar radiation into useable electrical energy. The solar cell semiconductor material can have a crystalline structure, e.g., single crystalline or polycrystalline silicon, or a non-crystalline structure, e.g., amorphous silicon. Energy conversion occurs as the result of what is well known in the solar cell field as the "photovoltaic effect". Two basic steps are involved in the photovoltaic effect. Initially, solar radiation absorbed by a semiconductor body generates electrons and holes. Secondly, the electrons and holes are separated by a built-in electric field in the semiconductor body of the solar cell. This separation of electrons and holes results in the generation of an electrical current. A built-in electric field can be generated in a solar cell by, for example, a Schottky barrier. The electrons generated at the metal (Schottky barrier) semiconductor body junction flow towards the semiconductor body.

Cermets, also known as granular metals, are composite materials consisting of finely dispersed mixtures of immiscible metals and insulators. They can act as Schottky barriers when applied to single crystalline n-type silicon and gallium arsenide as is known, see for example, J. Appl. Phys., Vol. 45, No. 1, January, 1974. However, due to the differences between crystalline and amorphous silicon, see IEEE Transactions On Electronic Devices, Vol. ED-24, No. 4, April, 1977, no conclusions can be extrapolated as to whether or not a cermet which acts like a Schottky barrier to crystalline silicon will also act like a Schottky barrier to amorphous silicon.

Hydrogenated amorphous silicon photovoltaic devices described in U.S. Pat. No. 4,064,521 are capable of converting solar radiation into useable electrical energy. Schottky barrier hydrogenated amorphous silicon solar cells are fabricated by glow discharging silane ($SiH_4$) to deposit a body of hydrogenated amorphous silicon and thereafter evaporating a film of platinum or another high work function metal to form a Schottky barrier on the deposited body of hydrogenated amorphous silicon. It has been noted that immediately after the evaporation of the Schottky barrier metal films, the resultant Schottky barrier solar cell has inferior diode characteristics. A good Schottky barrier develops only after a certain prescribed annealing procedure, e.g., annealing in forming gas at about 200° C. for about 15 minutes. This treatment apparently results in the formation of some thin interface layer, thus far of unknown nature. Schottky barriers thus formed are susceptible to the presence of electrical shorts and shunts, which can preclude the fabrication of large area solar cells. Attempts to reduce the cost and speed for processing of hydrogenated amorphous silicon solar cells by sputtering the platinum film results in a higher percentage of cells with shorts or shunts. The incidence of shorts and shunts also increases with increasing solar cell area.

Electrical shorts occur when there is a pinhole in the amorphous silicon body and the front and back electrodes are touching. A shunt is the loss of charge in the amorphous silicon body due to imperfect barrier formation or the formation of an ohmic contact by the work function metal rather than a Schottky barrier. Electrical shorts and shunts either greatly reduce or completely eliminate the electricity generated by the amorphous silicon solar cell.

When the amorphous silicon solar cell is fabricated in a PIN configuration, the transparent conductive oxide or transparent metal electrode tends not to adhere well to the p+layer. Poor adherence of the transparent conductive metal or metal oxide to the p+layer results in poor solar cell performance.

Thus, it would be desirable to find a material which can be applied to a hydrogenated amorphous silicon body by either sputtering or co-sputtering, act as a Schottky barrier or adhere well to a p+amorphous silicon layer in a PIN amorphous silicon solar cell and minimize the effect of pinholes in the amorphous silicon film.

SUMMARY OF THE INVENTION

A hydrogenated amorphous silicon solar cell incorporates a transparent high work function metal cermet which forms the Schottky barrier in a Schottky barrier amorphous silicon solar cell and adheres well to a p+amorphous silicon layer in a PIN amorphous silicon solar cell.

DETAILED DESCRIPTION OF THE INVENTION

Cermets having the formula:

$$M_x I_{(1-x)}$$

wherein M is a high work function metal selected from the group consisting of platinum, iridium, palladium, rhodium, rhenium, and the like; I is an insulator selected from the group consisting of $SiO_2$, $Al_2O_3$, $Si_3N_4$, BN, MgO, $TiO_2$, $ZrO_2$, $Si_W O_y N_Z$ (silicon oxynitride), and other insulators or ceramics which have bandgaps higher than about 4.0 eV; and x is from about 0.10 to about 0.85 volume fraction of the metal (M), are useful herein. Preferably, x varies from about 0.25 to about 0.40. The resistivity of the cermet can vary from about $10^7$ $\Omega$/cm to about less than $10^{-3}$ $\Omega$/cm. Cermets useful herein form Schottky barriers in hydrogenated amorphous silicon solar cells and adhere well to the p+ type amorphous silicon layer in a PIN amorphous silicon solar cell. Apparently, due to the difference in crystalline structure between amorphous silicon and single crystalline silicon, nickel will not form a good Schottky barrier to undoped or intrinsic hydrogenated amorphous silicon, although it will form a Schottky barrier to n-type single crystalline silicon. At a constant film thickness, the optical transmittance of cermets increases approximately exponentially with decreasing metal content. The cermets have optical transmittance superior to a similar thickness of metal.

Figure 1:
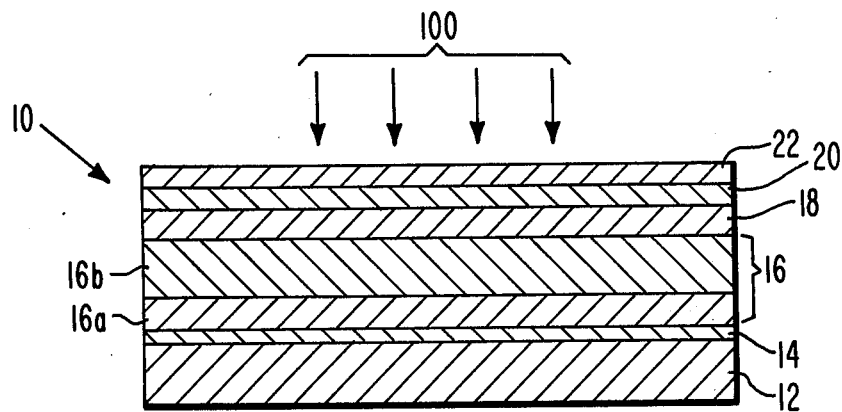
FIG. 1 is a cross-sectional view of a Schottky barrier amorphous silicon solar cell incorporating a transparent high work function metal cermet as the Schottky barrier.

FIG. 1 illustrates an amorphous silicon solar cell 10 of the invention. The solar cell 10 includes a substrate 12 and a layer 14 of metal such as gold, niobium, aluminum, nickel, molybdenum, tungsten, chromium, iron and the like or some other material which has a good electrical conductivity and the ability to form an ohmic contact with the hydrogenated amorphous silicon layer 16. If layer 14 is sufficiently thick to provide physical integrity for the amorphous silicon solar cell 10, e.g., stainless steel about 1 mm thick, then substrate 12 is unnecessary. The hydrogenated amorphous silicon layer 16 has a region of N-type conductivity 16a, about 200 to about 500 angstroms thick, which forms an ohmic contact to layer 14 and an intrinsic or insulating layer of amorphous silicon 16b about 5,000 to about 10,000 angstroms thick. The hydrogenated amorphous silicon layer 16 is deposited by glow discharge in silane and the transition from N-type 16a to intrinsic 16b can be either a graded transition or an abrupt transition. The hydrogenated amorphous silicon layer 16 and subsequently deposited layers require a radio frequency (RF) capacitive discharge at a frequency of at least about 3 MHz or higher. The transparent high work function metal cermet layer 18, about 50 to about 200 angstroms thick and preferably 100 angstroms thick, contacting the amorphous silicon layer 16, forms a Schottky barrier thereto. A transpatent conductive oxide layer 20, such as tin oxide, indium oxide, indium tin oxide, and the like, about 100 angstroms thick and exhibiting a sheet resistivity of at least about 10 $\Omega/\square$, forms an ohmic contact to the transparent high work function metal cermet layer 18 to help withdraw the current generated during irradiation of the amorphous silicon solar cell 10 by light 100. With large area hydrogenated amorphous silicon solar cells, i.e., greater than 3 cm$^2$, the transparent conductive oxide layer can be supplemented by grid structures known in the art to withdraw the current generated during the operation of the solar cell. To increase the current generated by the cell, an antireflection coating 22 may be applied to the transparent conductive oxide layer 20 to reflect solar radiation back inside the cell to be absorbed in the amorphous silicon layer 16.

Figure 2:
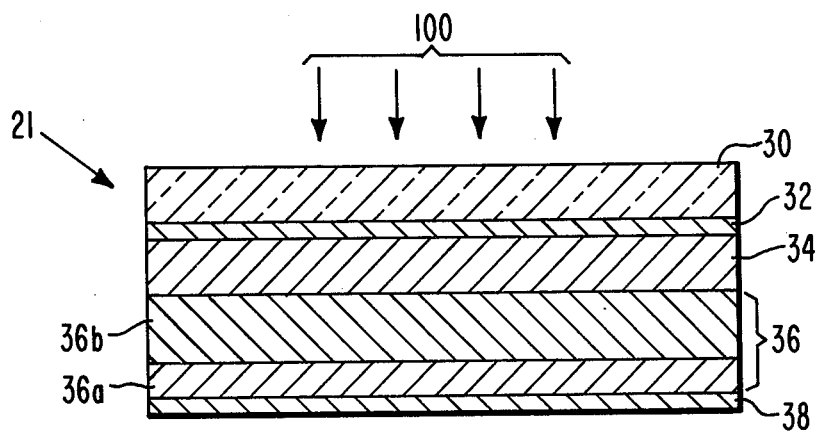
FIG. 2 is a cross-sectional view of an inverted Schottky barrier amorphous silicon solor cell incorporating a transparent high work function metal cermet as the Schottky barrier.

FIG. 2 illustrates an inverted amorphous silicon solar cell 21 incorporating a high work function metal cermet Schottky barrier. The inverted solar cell 21 comprises a solar radiation transparent substrate 30 such as soda lime glass, fused silica, borosilicate glass and the like. A transparent conductive oxide layer 32 is deposited on substrate 30. The transparent high work function metal cermet layer 34 is deposited on the transparent conductive oxide layer 32. Thereafter, a hydrogenated amorphous silicon layer 36 is deposited on the cermet layer 34 which forms a Schottky barrier thereto. The hydrogenated amorphous silicon layer 36 is graded from intrinsic or insulating hydrogenated amorphous silicon 36b to N-type hydrogenated amorphous silicon 36a. A back contact 38 is then deposited on the hydrogenated amorphous silicon layer 36 forming an ohmic contact to the N-type layer 36a.

Figure 3:
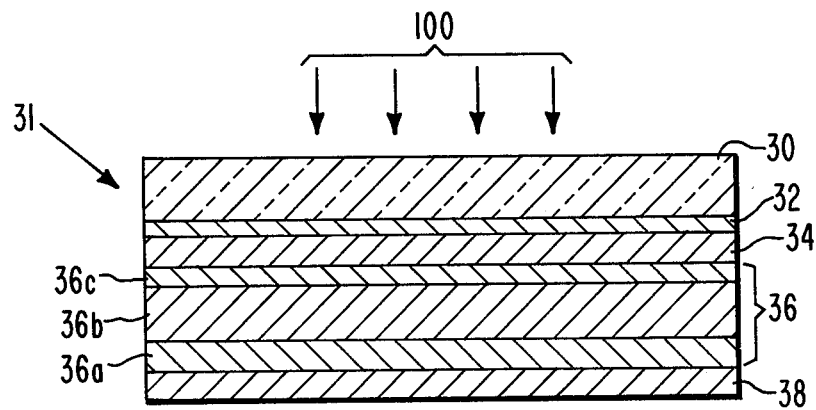
FIG. 3 is a cross-sectional view of a PIN amorphous silicon solar cell incorporating a transparent high work function metal cermet.

FIG. 3 refers to an inverted PIN solar cell 31. The solar cell 31 is similar to the inverted Schottky barrier structure of FIG. 2 with the exception that solar cell 31 includes a p+ type doped region 36c, about 100 to about 300 angstroms and preferably about 100 angstroms thick, of hydrogenated amorphous silicon. Although the transparent high work function metal cermet would appear not to be needed in a PIN solar cell structure, the cermet adheres well to the p+ amorphous silicon layer, permits the formation of a good ohmic contact to the transparent conducting oxide layer 32. The inverted structure of solar cells 21 and 31 have increased resistance to ambient temperature and weather conditions because of the shielding effect of the transpatent substrate 20.

The transparent high work function metal cermets can be applied to hydrogenated amorphous silicon devices by methods known in the art, as taught in Appl. Phys. Solid State Science, Vol. 6, Academic Press, Inc., 1976. Amorphous silicon solar cells can be formed as described in U.S. Pat. No. 4,064,521, herein incorporated by reference.

As an example, a float glass substrate is washed in a detergent solution in an ultrasonic bath and thereafter rinsed with water and dried by dust free hot air at about 100° C. A transparent conductive oxide layer such as indium tin oxide, is radio frequency (RF) or magnetron sputtered onto the glass substrate to a resistance of not less than about 10 $\Omega/\square$. The RF generator is operated at a frequency of about 15.6 megahertz (MHz). The sputtering targets are discs 14.6 cm in diameter. Thereafter, a mica mask is made to cover a narrow border around the substrate to prevent the deposition of subsequent films on the indium tin oxide and to provide a space for a wire or suitable current withdrawing means to be attached thereto. A thin layer of about 100 angstroms of a PtSiO$_2$ cermet with a platinum content of about 25 to about 45% by volume of the total cermet composition is deposited by RF sputtering on the indium tin oxide. The system is pumped down to about $5 \times 10^{-7}$ Torr and the substrate is heated to about 230° C. and argon gas is bled into the system at the rate of about 5 sccm. The argon gas flow is maintained such that there is an argon pressure of about 5 Torr in the sputtering chamber. The target is pre-sputtered with a shutter over the substrate for 15 minutes and thereafter the shutter is opened and the sputtering is continued for about 1.2 minutes during which time about 80 angstroms of platinum cermet is deposited. With the system pressure at $5 \times 10^{-7}$ Torr, the substrate is further heated to about 330° C. and the appropriately doped layers of amorphous silicon are applied in accordance with the Carlson et al patent, supra. However, RF capacitive discharge was used instead of Direct Current (DC) glow discharge. About 25 seconds is required to deposit about 200 angstroms of p+ hydrogenated amorphous silicon. The intrinsic layer is deposited to a thickness of about 5,000 angstroms in about 11 minutes. The N-type of hydrogenated amorphous silicon is deposited on the intrinsic amorphous silicon to a thickness of about 900 angstroms in about 2 minutes. After the formation of the N-type hydrogenated amorphous silicon, the mica mask is removed and a smaller mask is placed on the hydrogenated amorphous silicon. Finally, about 5,000 angstroms of aluminum is deposited in about 30 minutes and a wire is attached to the aluminum layer.

For the deposition of the amorphous silicon layers the flow of SiH$_4$ was 20 sccm. For p+ doping 0.05% B$_2$H$_6$ was added to the SiH$_4$ and for the n+ doping 0.1% PH$_3$ was used. The total pressure of the gases during the deposition of the amorphous silicon layers was about 20μ.

Although the basic structure of amorphous silicon solar cells is well known in the art, it is believed that the present invention is the first use of a transparent high work function metal cermet layer to provide the Schottky barrier in amorphous silicon solar cells or to provide good contact to the p+ type layer of a PIN amorphous silicon solar cell. In addition, the cermet forms a good ohmic contact to the transparent conductive oxide. Furthermore, the cermet can be used with the transparent conductive oxide and antireflection coatings to maximize the voltage output of an amorphous silicon solar cell.

The skilled artisan will realize that the transpatent high work function metal cermet can be used in other amorphous silicon solar cells such as non-inverted PIN structures, PN junction solar cells, intrinsic amorphous silicon solar cells and heterojunction photovoltaic solar cells and the like. Therefore, it should be understood that I do not intend to limit by invention solely to the examples described herein but rather it is my intention to include such modifications as would be obvious to the ordinary workers skilled in the design of solar cells.

I claim:

1. In an amorphous silicon solar cell which comprises a body of hydrogenated amorphous silicon with a means for ohmically contacting said body of hydrogenated amorphous silicon incident to solar radiation and a metal layer ohmically contacting said body of hydrogenated amorphous silicon opposite to said incident surface, the improvement which comprises:
a transparent high work function metal cermet layer disposed between and contacting said means for forming an ohmic contact and said body of hydrogenated amorphous silicon.

2. In an amorphous silicon solar cell which comprises a body of hydrogenated amorphous silicon with a metal layer contacting said body of hydrogenated amorphous silicon incident to solar radiation forming a Schottky barrier thereto, means for ohmically contacting said Schottky barrier and a metal layer ohmically contacting said body of hydrogenated amorphous silicon opposite to said incident surface, the improvement which comprises:
utilizing a transparent high work function metal cermet layer as said metal Schottky barrier.

3. An amorphous silicon solar cell according to claim 1 or 2 wherein said cermet has the formula:

$$M_x I_{(1-x)}$$

wherein M is a high work function metal, I is an insulator, and x varies from about 0.10 to about 0.85.

4. An amorphous silicon solar cell according to claim 3 wherein said high work function metal is selected from the group consisting of platinum, iridium, palladium, rhenium, and rhodium.

5. An amorphous silicon solar cell according to claim 4 wherein the insulator is selected from the group consisting of $SiO_2$, $Al_2O_3$, $Si_3N_4$, BN, MgO, $TiO_2$, $ZrO_2$, silicon oxynitride, and ceramics which have bandgaps higher than about 4.0 eV.

6. An amorphous silicon solar cell according to claim 5 wherein said cermet is about 20 to about 200 angstroms thick.

7. An amorphous silicon solar cell according to claim 5 wherein x varies from about 0.25 to about 0.40.

8. An amorphous silicon solar cell according to claim 7 wherein said cermet is about 100 angstroms thick.

9. An amorphous silicon solar cell according to claim 1 or 2 wherein said cermet is $Pt_x SiO_{2(1-x)}$ and x varies from about 0.10 to about 0.85.

10. An amorphous silicon solar cell according to claim 9 wherein said cermet is about 20 to about 200 angstroms.

11. An amorphous silicon solar cell according to claim 9 wherein x varies from about 0.25 to about 0.40.

12. An amorphous silicon solar cell according to claim 11 wherein said cermet is about 100 angstroms thick.

13. An amorphous silicon solar cell according to claim 3 wherein said body of hydrogenated amorphous silicon is fabricated by a glow discharge of a silicon-containing compound.

14. An amorphous silicon solar cell according to claim 13 wherein said silicon-containing compound is silane.

15. An amorphous silicon solar cell according to claim 5 wherein said body of hydrogenated amorphous silicon is fabricated by a glow discharge in silane.

16. An amorphous silicon solar cell according to claim 9 wherein said body of hydrogenated amorphous silicon is fabricated by a glow discharge in silane.

* * * * *